(12) United States Patent
Ware

(10) Patent No.: US 10,663,558 B2
(45) Date of Patent: May 26, 2020

(54) SYSTEMS AND METHODS FOR DETECTING PHYSICAL ASSET LOCATIONS

(71) Applicant: SCHNEIDER ELECTRIC IT CORPORATION, West Kingston, RI (US)

(72) Inventor: Gary R. Ware, Newton, MA (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 467 days.

(21) Appl. No.: 14/720,148

(22) Filed: May 22, 2015

(65) Prior Publication Data

US 2016/0341813 A1 Nov. 24, 2016

(51) Int. Cl.
*G01S 3/80* (2006.01)
*G01S 5/22* (2006.01)
(Continued)

(52) U.S. Cl.
CPC .............. *G01S 5/22* (2013.01); *G01S 5/0036* (2013.01); *G01S 5/0081* (2013.01); *G01S 5/30* (2013.01); *G01S 11/14* (2013.01); *H05K 7/1498* (2013.01)

(58) Field of Classification Search
USPC ........................................................ 367/127
See application file for complete search history.

(56) References Cited

U.S. PATENT DOCUMENTS 4,675,863 A 6/1987 Paneth et al.
4,905,009 A * 2/1990 Ulich .................. G01S 13/08
342/118

(Continued)

FOREIGN PATENT DOCUMENTS

CN 1439104 A 8/2003
CN 1636355 A 7/2005
(Continued)

OTHER PUBLICATIONS

Stanley, Ben, and Phillip McKerrow. "Measuring range and bearing with a binaural ultrasonic sensor." Intelligent Robots and Systems, 1997. IROS'97., Proceedings of the 1997 IEEE/RSJ International Conference on. vol. 2. IEEE, 1997.*

(Continued)

*Primary Examiner* — Hovhannes Baghdasaryan
*Assistant Examiner* — Jonathan D Armstrong
(74) *Attorney, Agent, or Firm* — Lando & Anastasi, LLP

(57) ABSTRACT

According to one aspect, a system for determining a location of a device is provided. According to one embodiment, the system comprises a management component, a plurality of microphones including a first microphone and a second microphone, at least one receiving component, the at least one receiving component coupled to the plurality of microphones and configured to receive signals from the plurality of microphones related to an acoustic signal detected by the plurality of microphones, determine a first timestamp of the acoustic signal using the signals received from the first microphone, determine a second timestamp of the acoustic signal using the signals received from the second microphone, and send the first timestamp and the second timestamp to the management component, the management component being configured to receive the first timestamp and the second timestamp and calculate the location of the device using the first timestamp and the second timestamp.

16 Claims, 8 Drawing Sheets

(51) Int. Cl.
  *G01S 5/00* (2006.01)
  *G01S 5/30* (2006.01)
  *H05K 7/14* (2006.01)
  *G01S 11/14* (2006.01)

(56) References Cited

U.S. PATENT DOCUMENTS

| | | | |
|---|---|---|---|
| 5,056,106 A * | 10/1991 | Wang | A63B 57/00 |
| | | | 342/450 |
| 5,175,695 A * | 12/1992 | Czajkowski | G01S 15/74 |
| | | | 367/127 |
| 5,621,414 A * | 4/1997 | Nakagawa | G01S 5/14 |
| | | | 342/350 |
| 5,910,776 A | 6/1999 | Black | |
| 5,917,776 A * | 6/1999 | Foreman | H03K 17/94 |
| | | | 340/568.1 |
| 6,150,921 A | 11/2000 | Werb et al. | |
| 6,535,206 B1 * | 3/2003 | Xu | G06F 3/0346 |
| | | | 178/18.01 |
| 6,784,802 B1 | 8/2004 | Stanescu | |
| 6,903,656 B1 | 6/2005 | Lee | |
| 8,723,653 B2 | 5/2014 | Jansma | |
| 2002/0169914 A1 | 11/2002 | Shteyn | |
| 2002/0190845 A1 | 12/2002 | Moore | |
| 2003/0141962 A1 | 7/2003 | Barink | |
| 2003/0142587 A1 * | 7/2003 | Zeitzew | G01S 7/52004 |
| | | | 367/127 |
| 2003/0174099 A1 | 9/2003 | Bauer et al. | |
| 2005/0138439 A1 | 6/2005 | Rothman et al. | |
| 2005/0184856 A1 | 8/2005 | Pourchot | |
| 2005/0203987 A1 | 9/2005 | Ewing et al. | |
| 2005/0225439 A1 * | 10/2005 | Watanabe | B62D 15/027 |
| | | | 340/435 |
| 2005/0237194 A1 | 10/2005 | VoBa | |
| 2005/0246436 A1 | 11/2005 | Day et al. | |
| 2005/0280970 A1 | 12/2005 | Reynolds | |
| 2006/0072271 A1 | 4/2006 | Jones et al. | |
| 2006/0148279 A1 | 7/2006 | German et al. | |
| 2006/0167624 A1 | 7/2006 | Whalley et al. | |
| 2006/0238307 A1 | 10/2006 | Bauer et al. | |
| 2006/0247526 A1 | 11/2006 | Lee et al. | |
| 2006/0267772 A1 | 11/2006 | Knadle et al. | |
| 2008/0088415 A1 | 4/2008 | Quan | |
| 2008/0100456 A1 | 5/2008 | Downie et al. | |
| 2009/0027202 A1 | 1/2009 | Copeland et al. | |
| 2009/0096581 A1 | 4/2009 | Macauley et al. | |
| 2009/0108995 A1 | 4/2009 | Tucker et al. | |
| 2009/0207022 A1 * | 8/2009 | Reckeweg | G06K 7/0008 |
| | | | 340/572.1 |
| 2009/0267745 A1 | 10/2009 | Usami | |
| 2010/0214068 A1 | 8/2010 | Nadkarni | |
| 2010/0214873 A1 | 8/2010 | Somasundaram et al. | |
| 2011/0208450 A1 | 8/2011 | Salka et al. | |
| 2011/0248823 A1 * | 10/2011 | Silberbauer | H05K 7/1498 |
| | | | 340/10.1 |
| 2011/0279323 A1 | 11/2011 | Hung et al. | |
| 2011/0316690 A1 * | 12/2011 | Siegman | H05K 7/1498 |
| | | | 340/538 |
| 2013/0231779 A1 * | 9/2013 | Purkayastha | B25J 9/1697 |
| | | | 700/259 |
| 2014/0192622 A1 * | 7/2014 | Rowe | G01S 5/18 |
| | | | 367/117 |
| 2014/0292582 A1 | 10/2014 | Ware | |

FOREIGN PATENT DOCUMENTS

| | | |
|---|---|---|
| CN | 1639913 A | 7/2005 |
| CN | 1788212 A | 6/2006 |
| CN | 101315710 A | 12/2008 |
| CN | 202383720 U | 8/2012 |
| DE | 102006030077 A1 | 1/2008 |
| DE | 102007022906 B3 | 8/2008 |
| EP | 1 545 050 A2 | 6/2005 |
| EP | 1713145 A1 | 10/2006 |
| GB | 2 383 708 A | 7/2003 |
| JP | 2007088957 A | 4/2007 |
| WO | 0195240 A2 | 12/2001 |
| WO | 2002091680 A2 | 11/2002 |
| WO | 2003056356 A1 | 7/2003 |
| WO | 2009/097400 A1 | 8/2009 |

OTHER PUBLICATIONS

Nakahira, K., et al. "A self-adapting sonar ranging system based on digital polarity correlators." Measurement Science and Technology 15.2 (2003): 347.*

Svilainis, L., et al. "The influence of digital domain on time of flight estimation performance." AIP Conference Proceedings. vol. 1433. No. 1. AIP, 2012.*

Hightower, Jeffrey, and Gaetano Borriello. "Location systems for ubiquitous computing." Computer 34.8 (2001): 57-66.*

"Designing an Antenna for the M24LR64-R Dual Interface IC/RFID Device". AN2972 Application Note, Stmicroelectronics. Doc ID 15629 Rev 5. Feb. 1, 2010 pp. 1-23.

Extended European Search Report for application No. 16170026.5 dated Oct. 10, 2016.

Henderson, Jim, "Angle of arrival", From Wikipedia, the free encyclopedia, Mar. 10, 2011, 2 pages. retrieved from: https://en.wikipedia.org/wiki/Angle_of_arrival.

Number, Nick, "Indoor positioning systems", From Wikipedia, the free encyclopedia, Apr. 22, 2011, 5 pages. retrieved from: https://en.wikipedia.org/wiki/Indoor_positioning_system.

* cited by examiner

SYSTEMS AND METHODS FOR DETECTING PHYSICAL ASSET LOCATIONS

BACKGROUND

Technical Field

The technical field is generally the inventory control of physical assets, and more particularly, to systems and methods for detecting the location of physical assets.

Background Discussion

Current data center management systems enable users to track virtual information relating to devices in a data center. Virtual information may include a device's IP address, MAC address, serial number, etc. Devices may be moved to different locations in a data center. If a device sends a message indicating a power or cooling error, a user may be required to manually fix or replace the device or associated power or cooling equipment. If the device has been moved to a different location in a data center, it may take time to locate the malfunctioning device.

Some applications exist that display a virtual map of a data center. These applications use locations of devices that have been previously entered to show where a device should be located. However, if a device is moved from one location to another or switched with another device, the map becomes outdated and shows wrong information. Some device tracking systems use RFID tags that require users to manually create an inventory of items and then track the movement of the RFID device.

SUMMARY

Embodiments of the present application provide a system for detecting the physical location of a physical asset and associating the physical location with virtual information. In some examples disclosed herein, assets may refer to devices within a data center (e.g., servers, cooling systems, network switches) that may be located in, for example, an enclosure such as a rack in a data center. The physical assets may be located within a factory, a data center, an enclosure, etc. Typical current tracking systems do not automatically locate an asset and cannot automatically associate the physical location of an asset with the IP address of the asset.

According to one aspect, a system for determining a location of a device is provided. According to one embodiment, the system comprises a management component, a plurality of microphones including a first microphone and a second microphone, at least one receiving component, the at least one receiving component coupled to the plurality of microphones and configured to receive signals from the plurality of microphones related to an acoustic signal detected by the plurality of microphones, determine a first timestamp of the acoustic signal using the signals received from the first microphone, determine a second timestamp of the acoustic signal using the signals received from the second microphone, and send the first timestamp and the second timestamp to the management component, the management component being configured to receive the first timestamp and the second timestamp, and calculate the location of the device using the first timestamp and the second timestamp.

According to one embodiment, the at least one receiving component includes a plurality of receiving components, a first receiving component of the plurality of receiving components is coupled to the first microphone, and a second receiving component of the plurality of receiving components is coupled to the second microphone. According to one embodiment, the first receiving component further comprises a first clock and the second receiving component further comprises a second clock, wherein the first receiving component and the second receiving component are further configured to synchronize the first clock with the second clock. According to one embodiment, the management component is in data communication with the device and configured to send a message to the device to generate the acoustic signal.

According to one embodiment, the first timestamp is at least one of a first start timestamp and a first end timestamp and the second timestamp is at least one of a second start timestamp and a second end timestamp. According to one embodiment, the at least one receiving component is further configured to calculate a first period of the acoustic signal using the signals received from the first microphone and calculate a second period of the acoustic signal using the signals received from the second microphone.

According to one embodiment, the at least one receiving component is further configured to determine a first synthetic zero using the signals received from the first microphone, determine a second synthetic zero using the signals received from the second microphone, calculate a first set of zero crossing times for the signals with reference to the first synthetic zero, calculate a second set of zero crossing times for the signals with reference to the second synthetic zero, calculate the first period using the first set of zero crossing times, and calculate the second period using the second set of zero crossing times.

According to one embodiment, the management component is further configured to receive information descriptive of a height of a rack and a number of unit spaces in the rack and use the information to calculate a unit space of the device. According to one embodiment, the at least one receiving component is further configured to filter the acoustic signal using a band-pass filter. According to one embodiment, the management component is further configured to provide a representation of a rack including at least one representation of the location of the device in the rack.

According to one aspect, a method for determining a location of a device is provided. According to one embodiment, the method includes receiving, by a plurality of microphones, an acoustic signal from a device, receiving, by at least one receiving component, signals from the plurality of microphones related to the acoustic signal, determining a first timestamp of the acoustic signal using the signals received from a first microphone of the plurality of microphones, determining a second timestamp of the acoustic signal using the signals received from a second microphone of the plurality of microphones, sending the first timestamp and the second timestamp to a management component, receiving, by the management component, the first timestamp and the second timestamp, and calculating, by the management component, the location of the device using the first timestamp and the second timestamp.

According to one embodiment, the method further includes synchronizing a first clock of the at least one receiving component with at least one second clock of the at least one receiving component. According to one embodiment, the method further includes calculating a first period of the acoustic signal using the first set of samples and calculating a second period of the acoustic signal using the second set of samples.

According to one embodiment, the method further includes determining a first synthetic zero using the signals received from the first microphone, determining a second synthetic zero using the signals received from the second microphone, calculating a first set of zero crossing times for the signals received from the first microphone, calculating a second set of zero crossing times for the signals received from the first microphone, and calculating the first period using the first set of zero crossing times and calculating the second period using the second set of zero crossing times.

According to one embodiment, the first timestamp is at least one of a first start timestamp and a first end timestamp and the second timestamp is at least one of a second start timestamp and a second end timestamp. According to one embodiment, the method further includes sending a message to the device to generate the acoustic signal. According to one embodiment, the method further includes receiving information descriptive of a height of the rack and a number of unit spaces in the rack and using the information in calculating the location of the device.

According to one embodiment, the method further includes filtering the acoustic signal using a band-pass filter around a range of expected frequencies. According to one embodiment, the method further includes presenting a representation of a rack including at least one representation of the location of the device in the rack. According to some aspects, a system for determining the location of a device is provided. According to some embodiments, the system includes a plurality of microphones and means for determining the location at least in part by calculating a difference between times at which an acoustic signal generated by the device is received by each microphone of the plurality of microphones disposed at predefined positions relative to one another in a data center.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed subject matter. Particular references to examples and embodiments, such as "an embodiment," "an example," "another embodiment," "another example," "some embodiments," "some examples," "other embodiments," "an alternate embodiment," "various embodiments," "one embodiment," "at least one embodiments," "this and other embodiments" or the like, are not necessarily mutually exclusive and are intended to indicate that a particular feature, structure, or characteristic described in connection with the embodiment or example and may be included in that embodiment or example and other embodiments or examples. The appearances of such terms herein are not necessarily all referring to the same embodiment or example.

Furthermore, in the event of inconsistent usages of terms between this document and documents incorporated herein by reference, the term usage in the incorporated references is supplementary to that of this document; for irreconcilable inconsistencies, the term usage in this document controls. In addition, the accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
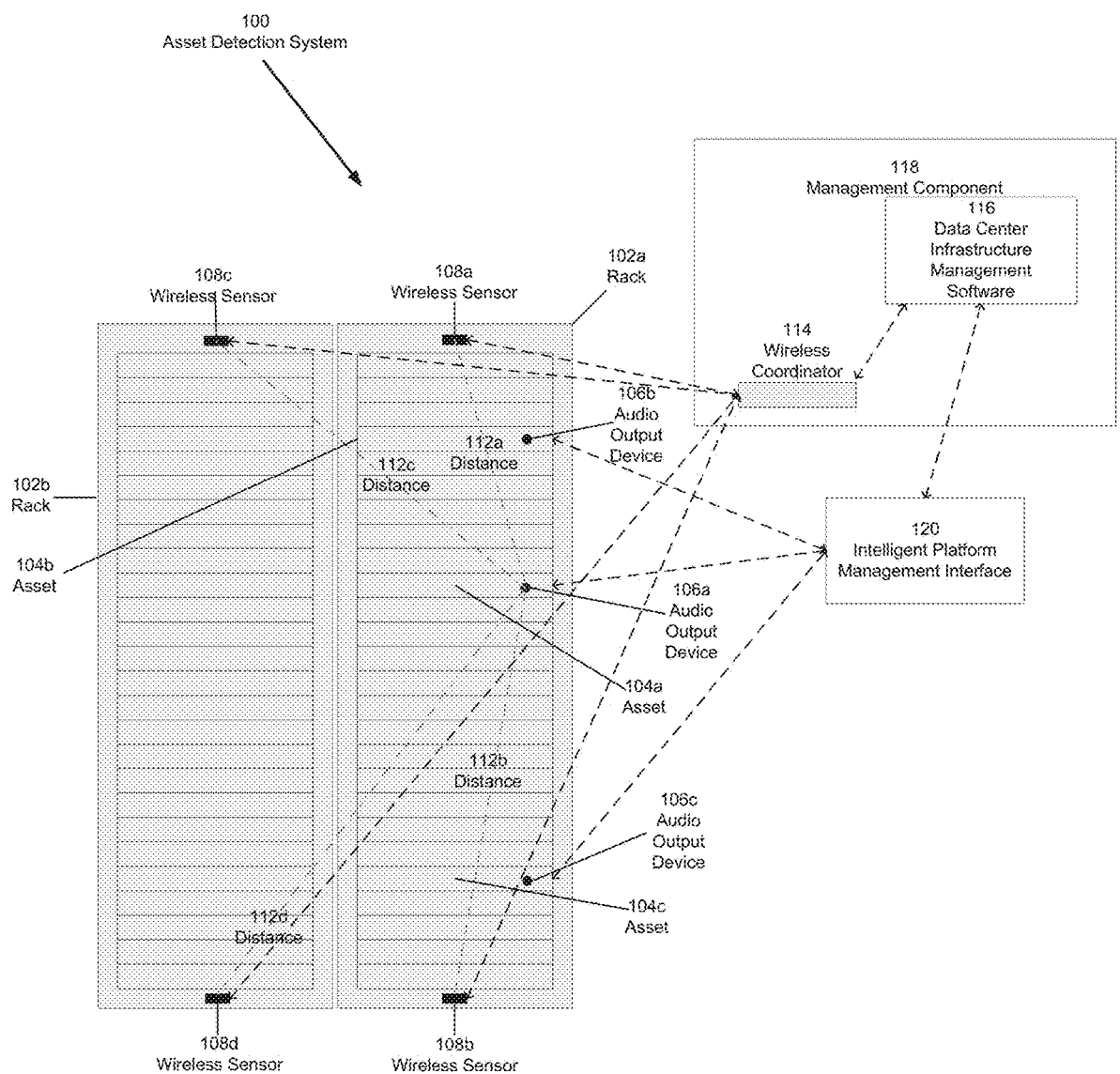
FIG. 1 is a diagram illustrating an asset locator system, according to one embodiment.

Some embodiments disclosed herein include apparatus and processes that implement an asset detection system that is configured to use an acoustic signal from an audio output device in an asset to detect the location of the asset. In some embodiments, an equipment rack may include multiple assets. In some embodiments, the assets may be placed vertically, horizontally, or a combination of vertically and horizontally in the equipment rack. Each asset may include an audio output device that may generate an acoustic signal. The equipment rack may include sensors that receive the acoustic signal, record a time of receipt, and broadcast time-stamped data to a wireless coordinator. The wireless coordinator may use the difference in receipt time between two sensors to determine a location of the asset.

At least one embodiment is directed to a system and method for determining the location of an asset. Once the location of the asset is determined, the location information may be sent to a coordinator. The coordinator may store other information relating to the asset, including power consumption information of the asset and cooling information relating to cooling resources that supply cooling to the asset. The coordinator may also receive and store temperature and humidity information from the asset. The location information may include which rack the asset is in and the location of the asset in the rack. At least some aspects provided herein are directed to a method and system of detecting an acoustic signal to determine the location of assets.

In some embodiments, the sensors are wireless. As disclosed herein, the term wireless may indicate that a wireless device may communicate with other devices over various communication protocols that do not require a physical connection. In some examples, there are two wireless sensors per rack. In these examples, the two wireless sensors may be in data communication with a wireless coordinator. The two wireless sensors may be independent of each other, and only connected via the wireless coordinator. The wireless coordinator may send messages to the two wireless sensors to synchronize clocks on the two wireless sensors. In other examples, the wireless coordinator sends messages to one wireless sensor including a microphone mounted on one part of a rack and a wire from the wireless sensor to a second microphone mounted on another part of the rack. This example may be less expensive to implement, since only one sensor is used.

In at least one embodiment, the wireless sensors are mounted on opposite sides of the equipment rack. In other embodiments, the wireless sensors are mounted anywhere on the rack frame or on the door of a rack. In some embodiments, wherein a single wireless sensor is used, the wireless sensor is mounted in the middle of an asset door and includes two wires to microphones. The wireless sensor may be used to determine which rack contains the asset. The wireless sensor may be battery powered, such as, for example, by AA lithium batteries or AAA lithium batteries. The wireless sensor may also be powered by an external solar panel or by a USB connection in the rack. The wireless sensor may be mounted by a fastener. The fastener may include, for example, magnets, screws, VELCRO, or a combination of materials.

In some examples, an acoustic signal from an audio output device may be received by the two microphones and the timing of the receipt may be used to determine the location of an asset. In some embodiments a band-pass filter may be incorporated to remove noise from the acoustic signal. In some examples, more than one beep may be sent to determine an accurate location of the asset.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

FIG. 1 illustrates an asset detection system 100 including racks 102a and 102b, assets 104a, 104b, and 104c, audio output devices 106a, 106b, and 106c, wireless sensors 108a, 108b, 108c, and 108d, an optional Intelligent Platform Management Interface (IPMI) 120, and a management component 118 including a wireless coordinator 114 and data center infrastructure management software (DCIM) 116. Each rectangle shape in the racks 102a and 102b is representative of an asset, according to this embodiment. FIG. 1 also illustrates distances 112a, 112b, 112c, and 112d of wireless sensors 108a, 108b, 108c, and 108d from the audio output device 106a. The racks 102a and 102b include many assets, such as asset 104a, 104b, and 104c, and each asset includes an audio output device, such as audio output devices 106a, 106b, and 106c inside the asset or attached to the asset. The wireless sensors 108a, 108b, 108c, and 108d are placed on the top and bottom of each equipment rack 102a and 102b, as illustrated in FIG. 1, on a different part of the rack frame, or on the door of the rack. The wireless sensors 108a, 108b, 108c, and 108d are in data communication with a wireless coordinator 114. The wireless coordinator 114 is in data communication with the DCIM 116, and together the wireless coordinator 114 and the DCIM 116 form a management component 118. The DCIM 116 communicates to the asset 104a via a remote server management interface such as Intelligent Platform Management Interface (IPMI) or Microsoft Windows Management Instrumentation (WMI) requesting a generation of an acoustic signal. In response to receiving the command, the asset 104a generates an acoustic signal via the audio output device 106a.

The wireless sensors 108a, 108b, 108c, and 108d are battery powered or connected to a power supply (e.g., USB powered via a component in the rack). The wireless sensors 108a, 108b, 108c, and 108d are in wired or wireless data communication with a wireless coordinator 114. The wireless coordinator 114 is a network appliance or device that can exchange information with various devices. In some embodiments, before the system attempts to locate the asset 104a, the wireless coordinator 114 or DCIM 116 receives input descriptive of the height of each rack, the height of an asset, the number of racks, the location of each rack, the location of wireless sensors and microphones on each rack, and other information.

In some embodiments, the wireless coordinator 114 is configured to calibrate all of the wireless sensors 108a, 108b, 108c, and 108d to have synchronized clocks. In one example, the clocks of the wireless sensors 108a, 108b, 108c, and 108d include a count indicating the current time. In other examples, the current time does not matter, and the clocks for the wireless sensors 108a, 108b, 108c, and 108d are synchronized such that they are all using similar clocks relative to each other.

In at least one embodiment, the DCIM 116 communicates with the asset 104a via agent software on the asset 104a. The DCIM sends a message to agent software on the asset 104a to trigger the audio output device 106a of the asset 104a. In another embodiment, the DCIM 116 communicates with the asset 104a via an Intelligent Platform Management Interface (IPMI) in a network. The asset 104a receives a command (e.g., a "SYS IDENTIFY" command) from the IPMI to trigger the audio output device 106a to make an acoustic signal.

In further embodiments, each asset 104a includes a beeping device that is fastened to the asset 104a. The beeping device may be external to the asset 104a and may be controlled directly from the DCIM 116 or the wireless coordinator 114.

In the example illustrated in FIG. 1, the audio output device 106a generates an acoustic signal and the wireless sensors 108a, 108b, 108c, and 108d receive the acoustic signal. In the physical arrangement shown in FIG. 1, the wireless sensor 108a receives the acoustic signal first because distance 112a is shorter than distances 112b, 112c, and 112d. The wireless sensors 108b, 108c, and 108d subsequently receive the acoustic signal. The wireless sensor 108b receives the acoustic signal before wireless sensor 108d because wireless sensor 108b is closer to the audio output device 106a. In some examples, each wireless sensor placed on the top is identified differently from wireless sensors placed on the bottom to create two groups of wireless sensors. In these examples, the first top wireless sensor and the first bottom wireless sensor to receive the acoustic signal is used to determine the location of the asset. In other embodiments, in which one wireless sensor is used with a top microphone and a bottom microphone or wherein each top wireless sensor is connected to a bottom wireless sensor, when one microphone receives an acoustic signal, the acoustic signal received by the connected microphone is automatically used regardless of whether or not another microphone picks up the acoustic signal before the connected microphone. Referring back to the example illustrated in FIG. 1, if wireless sensor 108c is closer to the audio output device 106a than wireless sensor 108b, the wireless coordinator ignores the received acoustic signal in wireless sensor 108c because wireless sensor 108a is the first top wireless sensor to receive the noise. Since wireless sensor 108b is labeled as a bottom sensor, the wireless coordinator 114 uses the time stamped data from wireless sensor 108b, since wireless sensor 108b is the first bottom sensor to receive the acoustic signal, despite being the third sensor to receive the acoustic signal overall.

The dotted lines in FIG. 1 indicate wired or wireless communication between components. The DCIM 116 sends a message to the wireless coordinator 114 to activate and synchronize the clocks of the wireless sensors 108a, 108b, 108c, and 108d. The wireless sensors 108a, 108b, 108c, and 108d switch from standby mode to receiving mode and send an acknowledgement message back to the wireless coordinator 114. Next, the DCIM 116 sends a message through the IPMI 120 to one of the assets 104a, 104b, and 104c to activate an associated audio output device 106a, 106b, or 106c. In other embodiments, the DCIM 116 sends a message directly to agent software on the asset to activate an audio output device 106a, 106b, or 106c. In further embodiments, the audio output devices 106a, 106b, and 106c are located external to the assets 104a, 104b, and 104c and the DCIM directly transmits a message to trigger an acoustic signal from one of the audio output devices 106a, 106b, and 106c.

In some embodiments, the wireless coordinator 114 synchronizes wireless sensors 108a, 108b, 108c, and 108d by sending a first message to turn on the wireless sensors 108a, 108b, 108c, and 108d from sleep mode. Once the wireless coordinator 114 receives an acknowledgement message from each of the wireless sensors 108a, 108b, 108c, and 108d, the wireless coordinator 114 sends either a message indicating the wireless sensors 108a, 108b, 108c, and 108d should stay on for a certain length of time or that the wireless sensors should turn on after a certain period of time (e.g., stay on for four minutes or turn on after five minutes). In some examples, the wireless sensors 108a, 108b, 108c, and 108d are configured to block interrupts such that the reception of the synchronization message is highly deterministic.

The synchronization message is received by all of the wireless sensors that are in listening mode. Once the message is received, a timer starts running at, for example, 10 to 50 microseconds per count. The timer may be a 16-bit counter that runs, for example, for a duration of 655 milliseconds to 3.3 seconds (the runtime may be more or less). Once the timer starts, the audio processor of each wireless sensor 108a, 108b, 108c, and 108d goes into a receiving mode, records the time that a first edge of an acoustic signal is received (e.g., as a 16-bit counter reading), records rising edge zero crossing times (e.g., 30,000 times) into a circular buffer, and stops receiving the acoustic signal after a few milliseconds pass without detecting an edge.

In one embodiment, when the period between edges of the acoustic signal is known, the receiving process of the wireless sensors 108a, 108b, 108c, and 108d may be refined. For example, the length of time the wireless sensors 108a, 108b, 108c, and 108d receive acoustic signals may be updated to the known period between edges times two or three. Once the wireless sensors 108a, 108b, 108c, and 108d finish receiving the edges, the wireless sensors 108a, 108b, 108c, and 108d record the time of the last edge received and send the recorded timestamps to the wireless coordinator 114. The wireless coordinator 114 may then determine an approximation for the distance the audio output device 106a, 106b, or 06c is from the wireless sensors 108a, 108b, 108c, and 108d based on the timestamps for the first and last edges and using an assumption that the acoustic signal is travelling at, for example, 75 microseconds per inch. Next, the wireless coordinator 114 may determine the difference in edges for each sample, determine an average phase difference to improve accuracy in the presence of noise, and refine the fractional feet (e.g., the inches) to be more accurate. If the first and last phase calculations differ significantly, the calculation may need to be redone by shifting the alignment of the received samples by one sample until a good correlation between the first phase and the last phase is found.

According to at least one example, if there is a zero time difference between the receipt time of the acoustic signal at the wireless sensor 108a and the wireless sensor 108b, the audio output device 106a, 106b, or 106c may be directly in between the two sensors. If there is phase lead or phase lag between the two received acoustic signals, the leading wireless sensor is closer to the audio output device.

In another embodiment, the wireless sensors 108a, 108b, 108c, and 108d create a synthetic zero using the maximum and minimum voltage of the acoustic signal. The wireless sensors 108a, 108b, 108c, and 108d then make a list of rising-edge zero crossings wherein the voltage passes the synthetic zero. The exact zero crossing is determined by interpolating time values before and after the synthetic zero crossing. The wireless sensors 108a, 108b, 108c, and 108d then calculate an initial waveform period and eliminate waveforms with a period that is more than a threshold value (e.g., 20%) different. The wireless sensors 108a, 108b, 108c, and 108d then update the initial waveform period with the periods of the waveforms that have not been eliminated. Next, the wireless sensors 108a, 108b, 108c, and 108d start from the middle of the list of rising-edge zero crossing times and work forwards and backwards by the average period to find the beginning and end of the first and last period. The beginning of the first period and the end of the last period are used as the start time and the end time of the acoustic signal respectively.

Next, the wireless sensors 108a, 108b, 108c, and 108d send either the end time to the wireless coordinator 114 and the wireless coordinator 114 use them to determine which rack an asset is in (e.g., by taking the earliest end time and the end time of the earliest end time wireless sensor's mate) and calculate the location of the asset. The coordinator 114 takes the difference of the two end times and multiplies that difference by the speed of sound in the rack (e.g., either determined based on the temperature and humidity of the room or used as a default value). That distance is the distance from the midpoint of the two wireless sensors, and whether the asset is above or below the midpoint is determined based on which wireless sensor received the acoustic signal first.

According to some embodiments, a band-pass filter may be used to remove noise from the acoustic signal. In one embodiment, the band-pass filter has a passband of 1-4 kHz. The filter may be generated by a precision component or the filter may be calibrated to minimize phase difference across the band (e.g., to less than 3 degrees). A big phase difference across the band may lead to miscalculations in distance due to noise. At 1 kHz, a phase difference of 3.6 degrees translates to 10 microseconds, which is about an eighth of an inch (a 1 kHz acoustic signal travels 1 millisecond per cycle). At 4 kHz, a phase of 3.6 degrees is only 2.5 microseconds, so the phase calibration at 4 kHz may be 12 degrees for the same time difference as 1 kHz. At 4 kHz, a full cycle of the acoustic signal is 2.5 inches, so catching the leading edge of the acoustic signal is important, and triggering more than one acoustic signal may be necessary for an accurate received acoustic signal.

Figure 3:
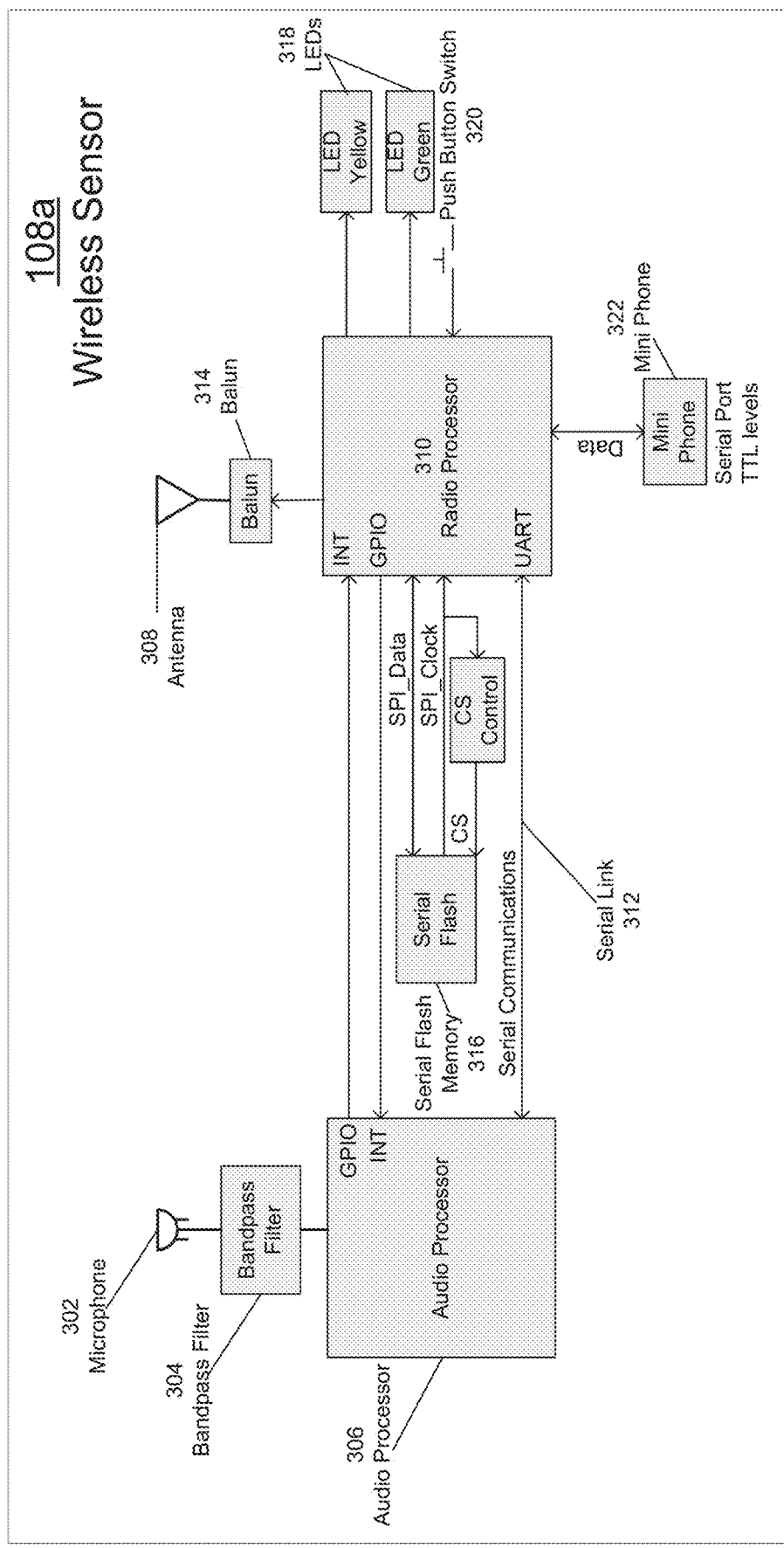
FIG. 3 is a block diagram of a wireless sensor, according to one embodiment.

FIG. 3 illustrates an example block diagram of a wireless sensor 108a, such as one of the wireless sensors 108a, 108b, 108c, and 108d shown in FIG. 1. The wireless sensor system 108a includes a microphone 302, a band-pass filter 304, an audio processor 306, an antenna 308, a radio processor 310, a serial link 312, a balun 314, a serial flash memory 316, LEDs 318, a push button switch 320, a mini phone 322.

In some embodiments, multiple microphones 302 are used with one wireless sensor 108a per rack. When an asset is going to generate an acoustic signal, the audio processor 306 receives a message from a coordinator to wake up and begin listening. The microphone 302 receives an acoustic signal from the asset and sends the acoustic signal to the audio processor 306. The band-pass filter 304 may filter the acoustic signal to reduce noise around an expected range of frequencies. The audio processor 306 includes RAM to hold a sample queue for the acoustic signal, circuitry that can be active with low power, and an audio to digital converter. The audio processor 306 samples the acoustic signal and determines a start time, end time, and period of the acoustic signal.

Once the audio processor 306 processes the acoustic signal, it may wake up the radio processor 310 and send a message containing information such as the sampled acoustic signal, the start time, the end time, and the period of the acoustic signal to the radio processor 310 via the serial link 312. The radio processor 310 may be included in a system on a chip (SoC) such as CC2530 SoC. The radio processor 310 then sends the message through the balun 314 and the antenna 308 to a wireless coordinator.

The serial flash memory 316 may receive downloaded flash images from a code base. The serial flash memory 316 is used to facilitate updates of the radio processor 310. The LEDs 318 may be bicolor LEDs that indicate the state of the radio processor 310 (e.g., whether or not the radio processor 310 is connected to a coordinator, whether the radio processor 310 is currently receiving information, etc.).

The push button switch 320 may be configured to disconnect a wireless sensor 108a from a coordinator to connect the wireless sensor 108a to a different coordinator. The push button switch 320 may also reset the radio processor 310, including resetting any memory of coordinators stored in the radio processor 310. According to one example, a received input such as a click on the push button switch 320 causes one action (e.g., a disconnect from a coordinator) and another received input such as a push and hold causes a different action (e.g., a reset of the radio processor 310). The mini phone 322 may be used for configuration of the radio processor 310.

Figure 4:
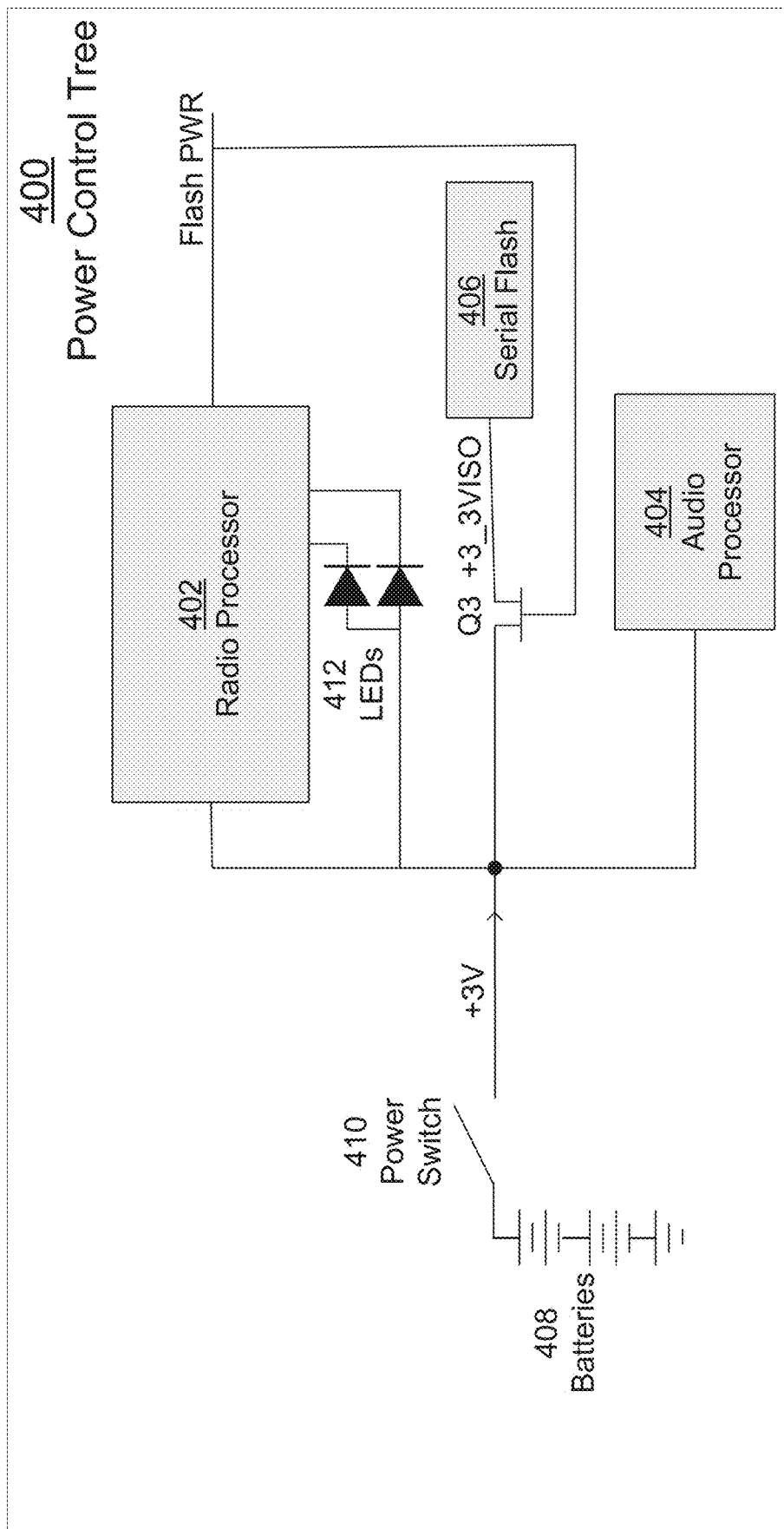
FIG. 4 is a block diagram of a power control tree for a wireless sensor, according to one embodiment.

FIG. 4 illustrates an example power control tree 400 that uses batteries 408 to power a radio processor 402, an audio processor 404, and LEDs 412. The batteries 408 may include, for example two 1.8 volt ultimate lithium AA cells, which are capable of providing adequate power to the radio processor 402, the audio processor 404, and LEDs 412 for extended periods of time. The batteries 408 may also be used to power a serial flash memory 406, but only when the serial flash memory 406 is used to, for example, update the firmware of the radio processor.

Figure 5:
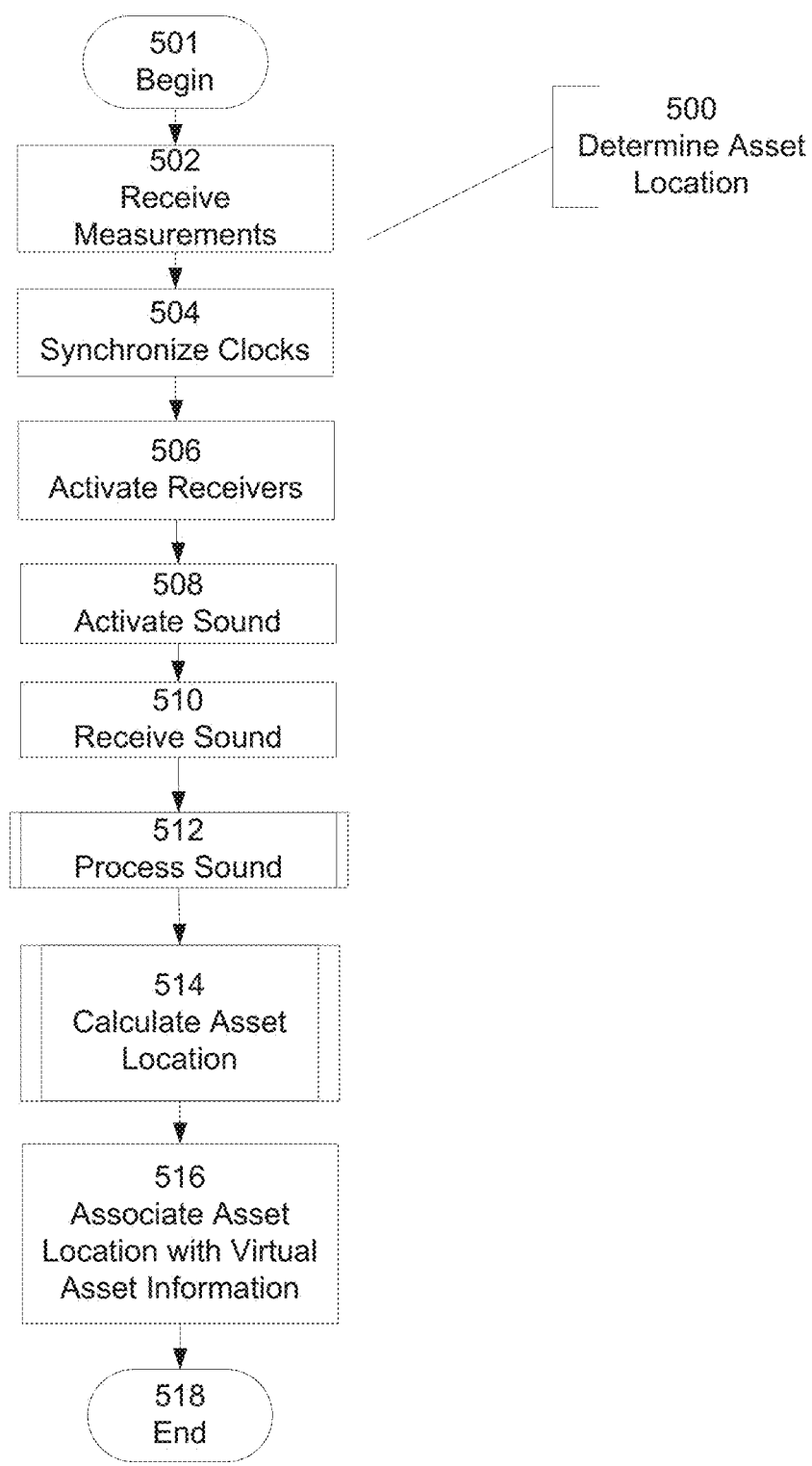
FIG. 5 is a process flow diagram for determining the location of an asset, according to one embodiment.
Figure 6:
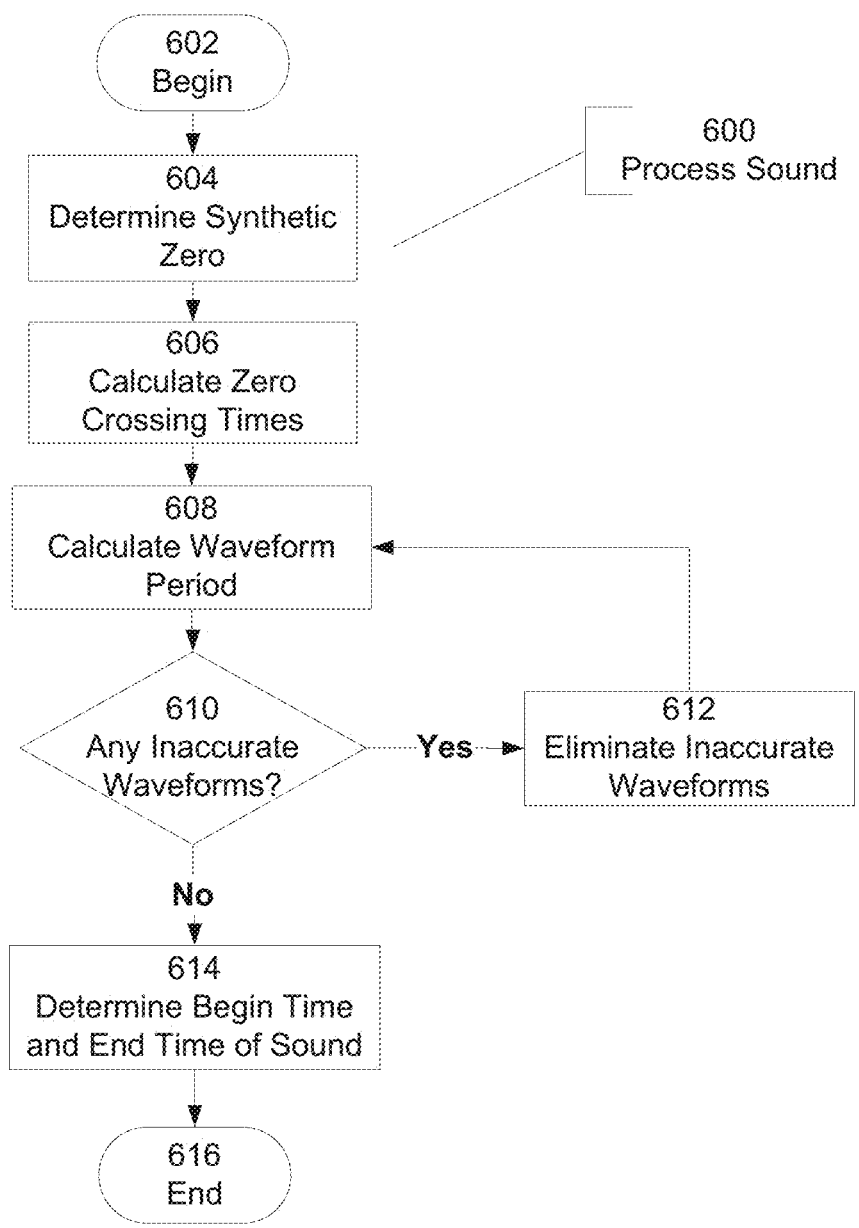
FIG. 6 is a process flow diagram for processing an acoustic signal from an asset, according to one embodiment.

FIG. 5 illustrates a process flow diagram for determining the location of an asset. At block 501, process 500 begins. At block 502, the DCIM receives input specifying measurements and information relating to assets and wireless sensors. For example, the DCIM may receive input specifying the rack number of each wireless sensor, the height of each rack, the number of unit spaces in the rack, and the height of each unit space. In other examples, instead of receiving input indicative of the number of unit spaces in each rack and the height of each unit space, the DCIM may receive input specifying the height of each rack in terms of unit spaces. The DCIM uses this information with the height of the rack in feet or meters to determine the height in feet or meters of each unit space and the number of unit spaces in the rack. In some examples, the DCIM receives the information specifying the position (e.g., top or bottom) of each wireless sensor. In some embodiments, the location of each wireless sensor may be automatically found using a method described in U.S. Patent Application Publication No. US 2014/0292582 A1, titled "System for locating devices using directional antennas," which is hereby incorporated herein by reference in its entirety.

In some embodiments, the height of the rack is automatically detected if the wireless sensors included an ability to make an acoustic signal. The wireless sensor that makes an acoustic signal may receive the acoustic signal and record a first set of timestamps and the opposite wireless sensor may receive the acoustic signal and record a second set of timestamps. In another embodiment, the wireless sensor that makes an acoustic signal may record the time the acoustic signal is sent. The two wireless sensors may send the first time recording of each set of timestamps to the coordinator. The coordinator may then use the two timestamps to determine a time difference between the timestamps and calculate the distance between the two wireless sensors using the time difference between the two sets of timestamps. If the first wireless sensor records a time T1 and the second wireless sensor records a time T2, the coordinator may determine a time T3=T2−T1. Then, using the speed of sound, the coordinator may determine the distance between the two wireless sensors by multiplying T3 by the speed of sound in the temperature of the rack. The distance between the two wireless sensors may be used as the height of the rack. In other embodiments, input specifying the height of the rack may be received manually from a user. The DCIM may create a skeleton database for received measurements and information if the assets are part of a stand-alone system. If the assets are part of a larger asset management system, the DCIM may receive access to the asset database of the larger asset management system and be configured to use, add, and update data in the asset database.

At block 504, wireless sensors are sent a clock synchronization message so all of the wireless sensors have synchronized clocks. In some examples, the DCIM may scan through an asset database and verify the location of known assets by using the IP address of the assets as a key. The DCIM may communicate with each asset via the asset's IP address. In these examples, if the rack of an asset is known, the coordinator may only turn on the wireless sensors in the rack containing the asset. Turning on a subset of wireless sensors as opposed to all of the wireless sensors in a data center may be useful to save energy.

In some examples, the DCIM or coordinator first sends a message to the wireless sensors to wake up at a specified time. The message may include an instruction to stay awake and block interrupts. The wireless sensors may receive the message and sleep until the specified time. After waking up, each of the wireless sensors may send a message to check in, indicating that it is ready to receive an acoustic signal. Once all of the wireless sensors have checked in, the wireless coordinator may send a time synchronization message, which all of the wireless sensors may process simultaneously to synchronize the clocks of all of the wireless sensors. In some examples, the wireless coordinator may send a message indicating a timer restart such that all of the wireless sensors start counting time at the same instance. Since all of the wireless sensors are blocking interrupts, the synchronization message may propagate through all of the wireless sensors in a deterministic fashion. In some embodiments, the wireless sensors may send an acknowledgement message indicating that they received the synchronization message.

When conducting a search for an asset, if it is not known which rack contains the asset, every wireless sensor may be activated. The clocks in all of the wireless sensors may receive a synchronization message from the coordinator to synchronize their clocks.

At block 506, the coordinator sends a message to wireless sensors to start a timer and go into a receiving mode. The timers of the wireless sensors may be set for a short period of time (e.g., below 4 seconds). The timer may run at 10-50 microseconds per count for 655 milliseconds to 3.3 seconds or so. At block 508, the DCIM sends a message to an asset (e.g., via an Intelligent Platform Management Interface or agent software on the asset) to generate an acoustic signal. The DCIM sends a message to an IP address being processed, telling the asset to produce the acoustic signal. The message may be an Intelligent Platform Management Interface identification message, which causes an acoustic signal. The acoustic signal may be, for example, a beeping noise. For example, the acoustic signal may be a basic input/output system (BIOS) beep from an asset. The DCIM or the IPMI may send a command (e.g., a "SYS IDENTIFY command) to cause a BIOS beep. The BIOS beep may also be initiated via other console port remote management interfaces such as an IP KVM sending the ASCII 'bell' (Ctrl-G on the keyboard) command through the keyboard port. The acoustic signal may be generated by an audio output device in the asset. The message may be sent to a software agent in an asset to produce an acoustic signal. In other embodiments, a wireless tag may be attached to an asset to generate the acoustic signal. In some embodiments, a battery powered tag may be used and the location of the tag may be correlated to the location of the asset (e.g., if tags are consistently placed on the right side of an asset, the DCIM may add a predetermined offset to the location of the asset). In other examples, the battery powered tag may be indicative of the true location of an asset (e.g., the location of the tag in a vertical axis of the rack may be indicative of a unit space of the asset in the rack).

At block 510, the wireless sensors receive the acoustic signal or signals related to the acoustic signal via microphones coupled to the wireless sensors. While receiving the acoustic signal, the wireless sensors may reduce noise in the acoustic signal by filtering the acoustic signal through a band-pass filter. In one embodiment, the band-pass filter is a hardware filter. In another embodiment, a software filter may be used. The wireless sensors may reduce noise around an expected range of acoustic signal frequencies. If the acoustic signal is a BIOS beep of an asset, for example, the beep may be known to have a frequency of 440 Hz and a duration of 2 seconds. In the example, if the wireless sensors sample the beep at a 20 times sampling rate, 35 kilobytes of RAM may be required by each wireless sensor. In one embodiment, each of the wireless sensors includes a radio processor and an audio processor. Each processor may be capable of waking up the other processor. The radio processor may include a 32 kHz low power block that may wake it up every 3 minutes to check in with the coordinator. When a listen command is received, the radio processor may wake up the audio processor and go to sleep. The audio processor may remain awake until the acoustic signal is received and processed. Once the audio processing is completed, the audio processor wakes up the radio processor to send the data.

When receiving an acoustic signal, the audio processor may sample the acoustic signal at, for example, a frequency equal to 16 to 20 times the expected frequency of the acoustic signal. The sampled acoustic signal may be deposited into a circular queue until a periodic acoustic signal is detected. The circular queue may contain the full detected acoustic signal with a small buffer in the beginning and the end to confirm that none of the acoustic signal is missed.

In one embodiment, the audio processor receives at least a portion of the acoustic signal and detects a maximum and minimum voltage of the acoustic signal. The audio processor then sets maximum and minimum threshold voltage values slightly below the maximum voltage and slightly above the minimum voltage. The audio processor then tracks voltage values that alternate above the maximum threshold and below the minimum threshold until a predetermined number of samples (e.g., 50) are received without any values above the maximum voltage threshold or below the minimum voltage threshold, indicating that the acoustic signal has ended. In other embodiments, the audio processor may start and stop tracking the acoustic signal when the voltage of the acoustic signal is below the minimum threshold or above the maximum threshold for more than a cycle. The audio processor may store all of the received acoustic signal samples in a buffer.

Figure 8:
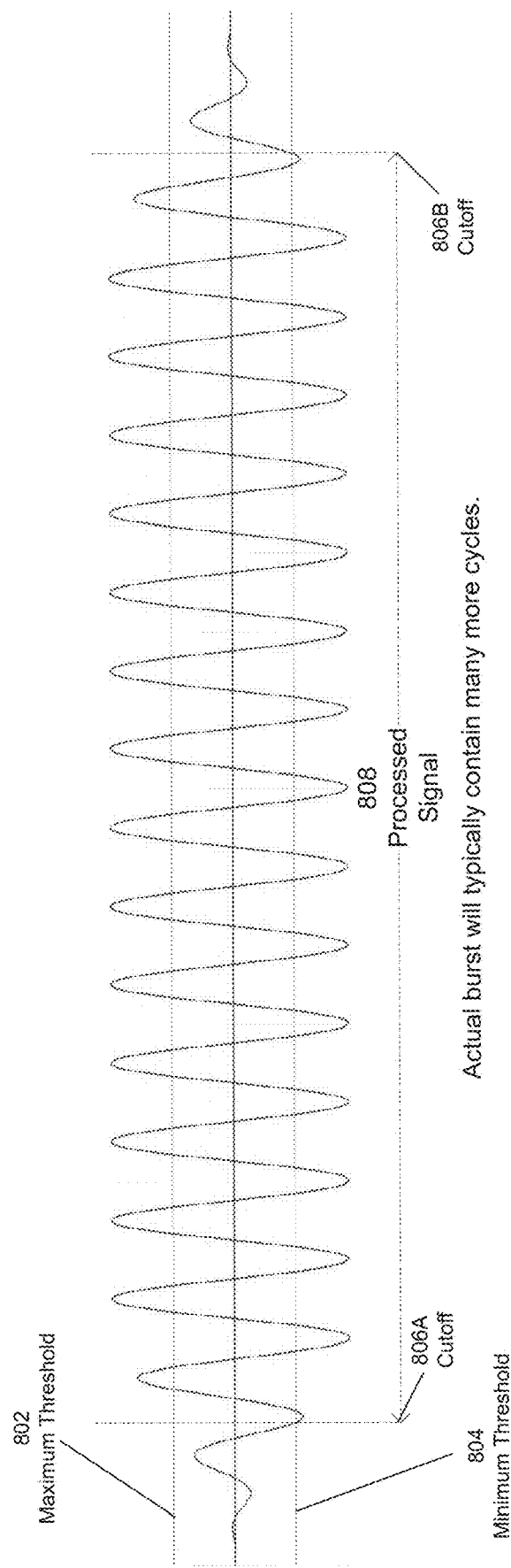
FIG. 8 is a graph showing an example acoustic signal, according to one embodiment.

FIG. 8 illustrates an example acoustic signal. The audio processor may include a maximum voltage threshold 802 and a minimum voltage threshold 804. When the voltage passes a threshold, the audio processor tracks the acoustic signal, for example, starting at cutoff 806A. The audio processor then stops tracking the acoustic signal when the voltage of the acoustic signal drops and stays below a threshold value, for example, at cutoff 806B. The audio processor then uses a resulting processed signal 808.

In some embodiments, each wireless sensor in range to detect the acoustic signal records rising edge zero crossing times of the acoustic signal as, for example, 16-bit timer readings in a circular buffer until a couple milliseconds pass with no edges heard, indicating that the acoustic signal has ended. Next, at block 512, the buffer of voltage values are processed.

Process 600 is a detailed process flow diagram for processing the acoustic signal according to one embodiment. Process 600 begins at block 602. At block 604, the audio processor determines a synthetic zero by taking a large number of samples (e.g., the whole buffer), detecting the maximum voltage value and the minimum voltage values in the samples, and taking the average of the two values. The average of the two values is determined as a zero level. Next, at block 606, the audio processor calculates zero crossing times. The audio processor then generates a list of rising-edge zero crossings by taking the times in which the samples cross from below zero level to above the zero level. The exact zero crossing time is calculated by interpolating between the time the samples cross from below the zero level and the time the samples are above the zero level. In one example, where an acoustic signal lasts 2 seconds at 440 Hz, the samples for the acoustic signal may include 880 cycles.

According to some embodiments, at block 608, after the zero crossing times are calculated, an initial waveform period is calculated by averaging the periods of all of the captured waveforms. Once an initial waveform period is calculated, at block 610, the audio processor checks if any of the waveforms have a period that is past a threshold value different from the calculated initial waveform period. If so, at block 612, the audio processor eliminates any waveforms that have a period more than the threshold value different from the initial waveform period. In one example, waveforms that have periods more than 20% different than the initial waveform period are deleted. After deleting inaccurate waveforms, the process 600 may go back to block 608 and the waveform period may be generated again by averaging all of the more accurate waveforms. Blocks 608, 610, and 612 may be repeated with a lower threshold or the same threshold as many times as needed to make an accurate sampled acoustic signal. In another embodiment, a more sophisticated median-time algorithm may also be used to calculate the average period of the acoustic signal.

In at least one embodiment, at block 614, after calculating the average period of the acoustic signal, starting around the middle of the list of samples, the audio processor parses the samples forwards and backwards by the average period until it reaches the last zero crossing on both ends of the samples. The audio processor detects the ends of the samples as the beginning and end of the acoustic signal. The total time between the ends of the acoustic signal may be a multiple of the waveform period. The audio processor then sends information descriptive of at least one of the begin-time, the end-time, and the average period of the acoustic signal to a radio processor via, for example, a serial link. The audio processor then goes into sleep mode or turns off, and the radio processor sends the information to a coordinator. The radio processor sends the information, plus an identifier of the wireless sensor indicating the location of the wireless sensor (e.g., top or bottom and rack number), through a balun and via an antenna. In some embodiments, the audio processor may only send the end-time to the radio processor, and the radio processor may send the end-time without the begin-time and the average period to the coordinator. Once the radio processor sends the information, the radio processor goes to sleep. At block 616, process 600 ends.

In an alternative embodiment, the coordinator may determine if the first and last phase calculations for each wireless sensor have a significant phase difference. If they vary significantly, the calculation may have to be done again. The coordinator may shift the alignment by one sample until a good correlation between the first samples and the last samples is found. Then the coordinator checks again to see if the phase calculations are close. This process may be repeated until there is a close phase difference or until the acoustic signal has to be activated again to try with a better sample set. Additionally, in some examples, a band-pass filter may be used to calibrate the phases to minimize the phase difference across the band, preferably to less than three degrees. In these examples, triggering more than one acoustic signal may be necessary to gain an accurate filter.

If the coordinator does not receive any messages from a wireless sensor, the coordinator may send a message to generate an acoustic signal again. If, after three attempts to generate an acoustic signal, no messages are received by a wireless sensor, the coordinator may mark the asset being searched for as having an unknown location.

Figure 7:
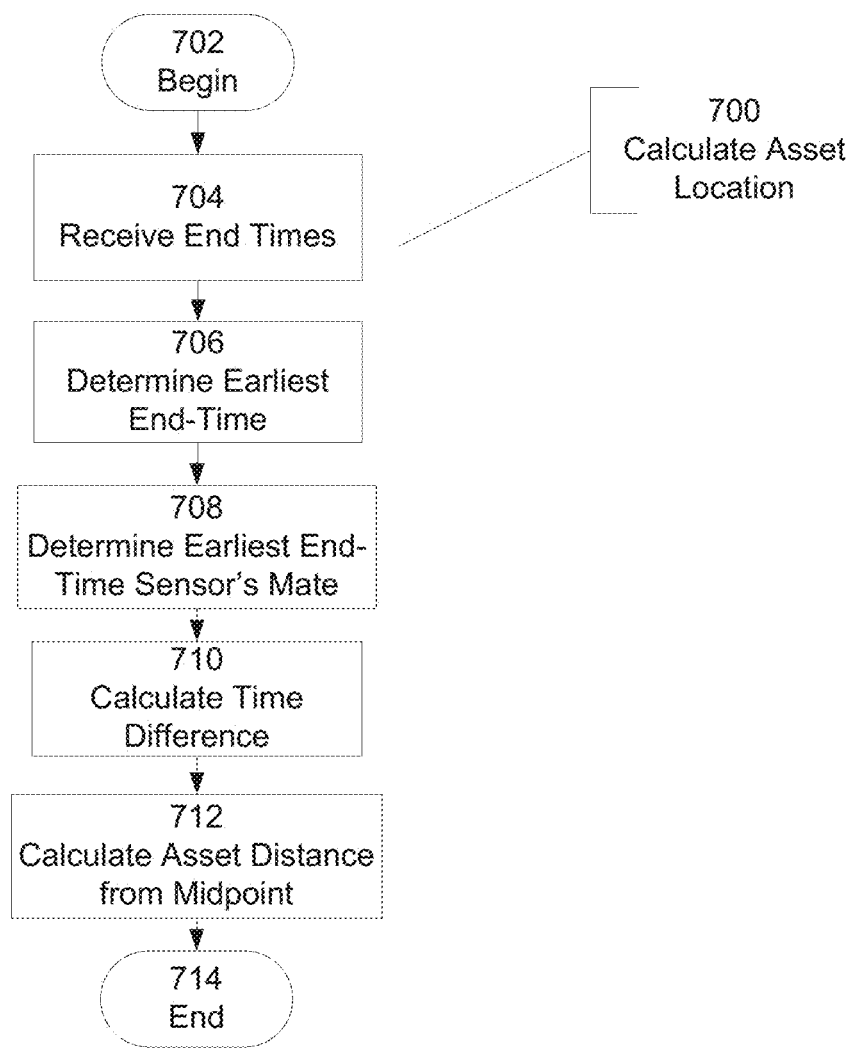
FIG. 7 is a process for calculating a location of an asset, according to one embodiment.

Referring back to FIG. 5, at block 514, if the coordinator does receive messages, the coordinator calculates the location of the asset in the rack. The location may be calculated in terms of a rack and a unit space in the rack, distance from each wireless sensor, a location in a virtual map, etc. Process 700 of FIG. 7 is a process flow diagram for calculating the location of the asset, according to one embodiment. At block 702, process 700 begins. At block 704, the coordinator receives information indicative of the end time of the acoustic signal from each of the receiving wireless sensors. At block 706, the coordinator chooses the message with the earliest end-time for the acoustic signal and uses the end-time as a reference point T1. At block 708, the end-time of the opposite wireless sensor or microphone in the rack is chosen as a second reference point T2. In another embodiment, the begin-times of the wireless sensor pair may be used. At block 710, the coordinator calculates a time T3 using the difference T2−T1 between the two end-times.

At block 712, the coordinator calculates the distance of the asset from a midpoint between the two wireless sensors in the rack. In some embodiments, the midpoint is chosen as the distance between the wireless sensor pair divided by two. In other embodiments, the midpoint is premeasured for each pair of wireless sensors. In some examples, the coordinator may multiply the time T3 (in microseconds) by the speed of sound (in meters per microsecond) and the length of each unit space (in units per meter) to find the distance of the asset from the midpoint in unit spaces. The speed of sound may be determined based on a default assumption of dry air and 68 degrees Fahrenheit. In one example, each rack may include a thermometer and humidity sensor to calculate an accurate speed of sound. Assuming a speed of sound of 1127 feet per second and a unit space height of 1.75 inches, the speed of sound equals approximately 0.007728 unit spaces per microsecond. Multiplying T3 in microseconds and 0.007728 in unit spaces per microsecond, the coordinator may calculate the distance in unit spaces from the midpoint. If T1 is received from the top wireless sensor, the distance may be the distance in unit spaces above the midpoint. If T1 is received from the bottom wireless sensor, the distance may be the distance in unit spaces below the midpoint.

In some embodiments, the coordinator may be removed from the system and the DCIM may receive time information from each wireless sensor and calculate the location of the origin of the acoustic signal (e.g., the asset). In other embodiments, the coordinator may receive the time information and forward either all of the time information or the time information from the relevant wireless sensors to the DCIM to calculate the location of the asset. At block 714, process 700 ends.

Once an asset location is calculated, the coordinator sends the asset location information to the DCIM. The asset location information may include the unit position of the asset and the rack number of the asset. At block 516, location information regarding the asset is associated with the virtual information in the DCIM. The location information may include a rack number, a location of the rack, and a unit space in the rack that holds the asset. The virtual information about the asset includes the asset's IP address. The virtual information about the rack includes the height of the rack, the number of unit spaces in a rack, and the location of the rack. At block 518, process 500 ends.

When the DCIM receives multiple unit space locations of assets in a rack, the DCIM may use the height of the rack and the height of each unit in the rack to put the assets in order based on the received physical location of each asset. In some embodiments, open spaces may be included in the measurement of a unit space and used in the calculation of the unit space of each asset. In some examples, an application may use the location information and virtual information associated with an asset and a rack containing the asset to generate a three-dimensional representation of the rack and the assets in the rack. The DCIM may further be configured to provide asset information to a user including both virtual information such as the IP address of the asset and physical information such as the unit space of the asset.

The DCIM may use the location information of an asset to create notifications for the power consumption and cooling resources of an asset. For example, if all of the assets in a specific rack are overheating, the DCIM can receive the overheating information, determine that the assets are all in the same rack, and display a notification indicating that the rack is not being properly cooled.

In some embodiments, the DCIM may update an application displaying a map of rack and asset locations. For example, an application on a mobile device may display a representation of a rack with a representation of an asset glowing within the rack. The representation of the asset may be displayed in a representation of the actual asset location. In this example, the application may further allow a user to send an update request for assets in the rack representation. An update process may include confirming the location of all of the assets that are expected to be in the represented rack by going through process 500 to confirm for each asset. If a wireless sensor of the rack does not receive a beep from one of the assets, an initial confirmation search may be used to find the asset. An initial confirmation search may follow the same steps as a normal confirmation, except all of the wireless sensors in different racks may be activated and used since the location of the missing asset is not known. The process of initially searching for an asset may consume more energy than confirming an asset's location, since more wireless sensors may be activated.

According to some embodiments, the DCIM may periodically verify existing assets from a database by going through process 500 for each asset. Additionally, new assets may be added by scanning the network for open IPMI ports using a new or existing list of subnets. In other examples, new assets may be added to the asset database manually by an operator or administrator. The DCIM may alternatively use IPv6 link local discovery processes to acquire new assets. Once new assets are received, the DCIM may turn on all wireless sensors to locate the new assets via, for example, process 500.

In some embodiments, the DCIM may run a port scan across a range of IP addresses to look for Intelligent Platform Management Interface (IPMI) ports that are open and find all devices (e.g., assets) that have audio output devices that can be used. The DCIM may accomplish this by listening on transmission control protocol and internet protocol ports.

In some embodiments, a similar process may be used to find the location of a different device. Any device may include a component to create an acoustic signal or be equipped with a tag that can make a predictable acoustic signal. The acoustic signal may be used in a similar embodiment to identify a location of a device within, for example, a room or a data center. A different filter may also be used to reduce noise in an environment. In at least one embodiment, more microphones may be used. If a space is too big for two microphones to detect an acoustic signal from a device, more microphones may be placed in the space to triangulate the source location of the acoustic signal.

In some examples, the DCIM may include a user interface that allows a user to manually begin a process to confirm the location of an asset. The process may receive a selection of an asset and find the asset using either two microphones in a rack if the rack of the asset is known or multiple microphones in different racks if the rack is not known.

Various aspects and functions described herein may be implemented as specialized hardware or software components executing in one or more computer systems. There are many examples of computer systems that are currently in use. These examples include, among others, network appliances, personal computers, workstations, mainframes, networked clients, servers, media servers, application servers, database servers, and web servers. Other examples of computer systems may include mobile computing devices (e.g., smart phones, tablet computers, and personal digital assistants) and network equipment (e.g., load balancers, routers, and switches). Examples of particular models of mobile computing devices include iPhones, iPads, and iPod touches running iOS operating system available from Apple, Android devices like Samsung Galaxy Series, LG Nexus, and Motorola Droid X, Blackberry devices available from Blackberry Limited, and Windows Phone devices. Further, aspects may be located on a single computer system or may be distributed among a plurality of computer systems connected to one or more communications networks.

Figure 2:
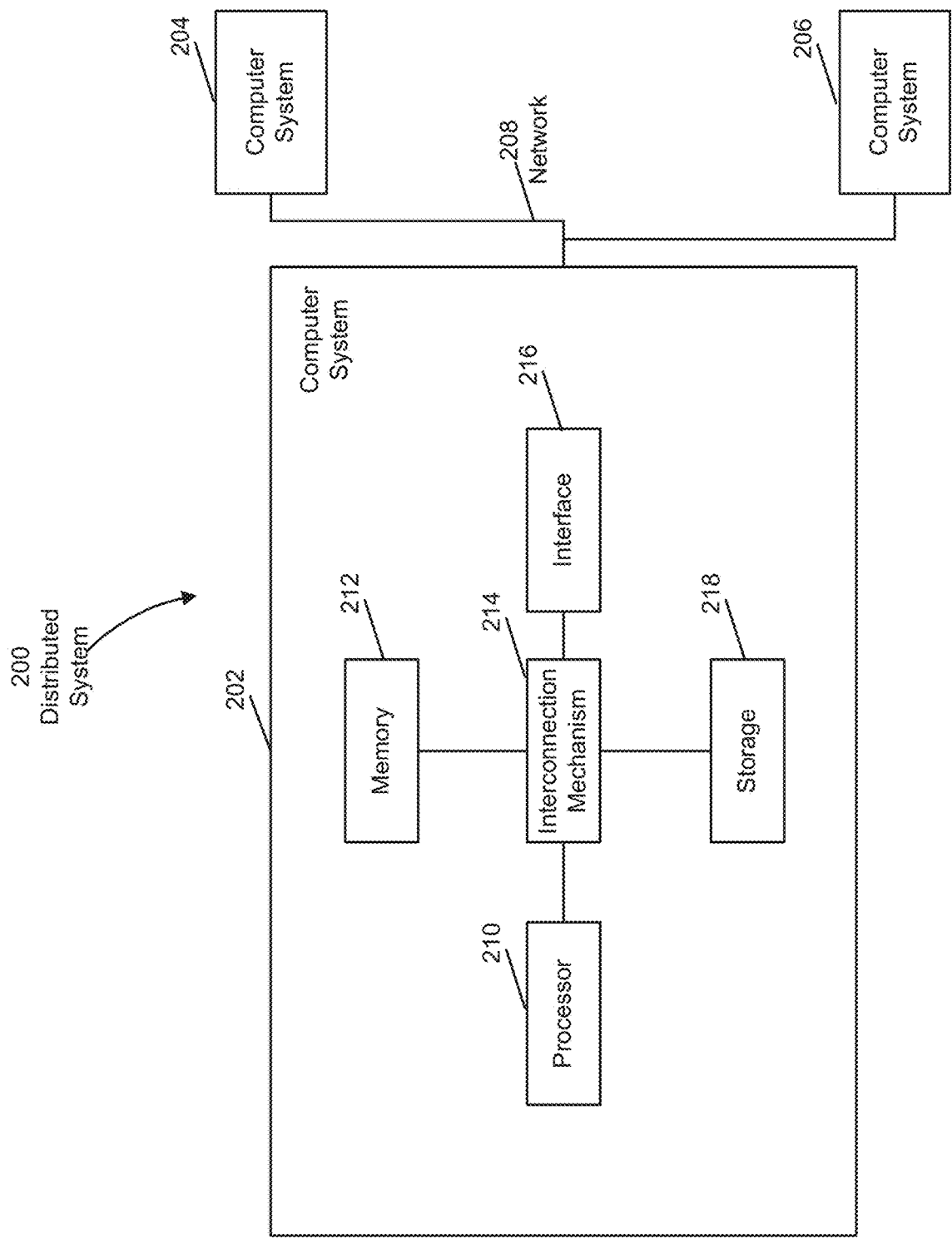
FIG. 2 shows a general-purpose computer system upon which various embodiments may be practiced.

For example, various aspects, functions, and processes may be distributed among one or more computer systems configured to provide a service to one or more client computers, or to perform an overall task as part of a distributed system, such as the distributed computer system 200 shown in FIG. 2. Additionally, aspects may be performed on a client-server or multi-tier system that includes components distributed among one or more server systems that perform various functions. Consequently, embodiments are not limited to executing on any particular system or group of systems. Further, aspects, functions, and processes may be implemented in software, hardware or firmware, or any combination thereof. Thus, aspects, functions, and processes may be implemented within methods, acts, systems, system elements and components using a variety of hardware and software configurations, and examples are not limited to any particular distributed architecture, network, or communication protocol.

Referring to FIG. 2, there is illustrated a block diagram of a distributed computer system 200, in which various aspects and functions are practiced. As shown, the distributed computer system 200 includes one or more computer systems that exchange information. More specifically, the distributed computer system 200 includes computer systems 202, 204, and 206. As shown, the computer systems 202, 204, and 206 are interconnected by, and may exchange data through, a communication network 208. The network 208 may include any communication network through which computer systems may exchange data. To exchange data using the network 208, the computer systems 202, 204, and 206 and the network 208 may use various methods, protocols and standards, including, among others, Fiber Channel, Token Ring, Ethernet, Wireless Ethernet, Bluetooth, IP, IPV6, TCP/IP, UDP, DTN, HTTP, FTP, SNMP, SMS, MMS, SS7, JSON, SOAP, CORBA, REST, and Web Services. To ensure data transfer is secure, the computer systems 202, 204, and 206 may transmit data via the network 208 using a variety of security measures including, for example, SSL or VPN technologies. While the distributed computer system 200 illustrates three networked computer systems, the distributed computer system 200 is not so limited and may include any number of computer systems and computing devices, networked using any medium and communication protocol.

As illustrated in FIG. 2, the computer system 202 includes a processor 210, a memory 212, an interconnection element 214, an interface 216 and data storage element 218. To implement at least some of the aspects, functions, and processes disclosed herein, the processor 210 performs a series of instructions that result in manipulated data. The processor 210 may be any type of processor, multiprocessor or controller. Example processors may include a commercially available processor such as an Intel Xeon, Itanium, Core, Celeron, or Pentium processor; an AMD Opteron processor; an Apple A4 or A5 processor; a Sun UltraSPARC processor; an IBM Power5+ processor; an IBM mainframe chip; or a quantum computer. The processor 210 is connected to other system components, including one or more memory devices 212, by the interconnection element 214.

The memory 212 stores programs (e.g., sequences of instructions coded to be executable by the processor 210) and data during operation of the computer system 202. Thus, the memory 212 may be a relatively high performance, volatile, random access memory such as a dynamic random access memory ("DRAM") or static memory ("SRAM"). However, the memory 212 may include any device for storing data, such as a disk drive or other nonvolatile storage device. Various examples may organize the memory 212 into particularized and, in some cases, unique structures to perform the functions disclosed herein. These data structures may be sized and organized to store values for particular data and types of data.

Components of the computer system 202 are coupled by an interconnection element such as the interconnection element 214. The interconnection element 214 may include any communication coupling between system components such as one or more physical busses in conformance with specialized or standard computing bus technologies such as IDE, SCSI, PCI and InfiniBand. The interconnection element 214 enables communications, including instructions and data, to be exchanged between system components of the computer system 202.

The computer system 202 also includes one or more interface devices 216 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow the computer system 202 to exchange information and to communicate with external entities, such as users and other systems.

The data storage element 218 includes a computer readable and writeable nonvolatile, or non-transitory, data storage medium in which instructions are stored that define a program or other object that is executed by the processor 210. The data storage element 218 also may include information that is recorded, on or in, the medium, and that is processed by the processor 210 during execution of the program. More specifically, the information may be stored in one or more data structures specifically configured to conserve storage space or increase data exchange performance. The instructions may be persistently stored as encoded signals, and the instructions may cause the processor 210 to perform any of the functions described herein. The medium may, for example, be optical disk, magnetic disk or flash memory, among others. In operation, the processor 210 or some other controller causes data to be read from the nonvolatile recording medium into another memory, such as the memory 212, that allows for faster access to the information by the processor 210 than does the storage medium included in the data storage element 218. The memory may be located in the data storage element 218 or in the memory 212, however, the processor 210 manipulates the data within the memory, and then copies the data to the storage medium associated with the data storage element 218 after processing is completed. A variety of components may manage data movement between the storage medium and other memory elements and examples are not limited to particular data management components. Further, examples are not limited to a particular memory system or data storage system.

Although the computer system 202 is shown by way of example as one type of computer system upon which various aspects and functions may be practiced, aspects and functions are not limited to being implemented on the computer system 202 as shown in FIG. 2. Various aspects and functions may be practiced on one or more computers having a different architectures or components than that shown in FIG. 2. For instance, the computer system 202 may include specially programmed, special-purpose hardware, such as an application-specific integrated circuit ("ASIC") tailored to perform a particular operation disclosed herein. While another example may perform the same function using a grid of several general-purpose computing devices running MAC OS System X with Motorola PowerPC processors and several specialized computing devices running proprietary hardware and operating systems.

The computer system 202 may be a computer system including an operating system that manages at least a portion of the hardware elements included in the computer system 202. In some examples, a processor or controller, such as the processor 210, executes an operating system. Examples of a particular operating system that may be executed include a Windows-based operating system, such as, Windows NT, Windows 2000 (Windows ME), Windows XP, Windows Vista or Windows 7 operating systems, available from the Microsoft Corporation, a MAC OS System X operating system or an iOS operating system available from Apple Computer, one of many Linux-based operating system distributions, for example, the Enterprise Linux operating system available from Red Hat Inc., a Solaris operating system available from Oracle Corporation, or a UNIX operating systems available from various sources. Many other operating systems may be used, and examples are not limited to any particular operating system.

The processor 210 and operating system together define a computer platform for which application programs in high-level programming languages are written. These component applications may be executable, intermediate, bytecode or interpreted code which communicates over a communication network, for example, the Internet, using a communication protocol, for example, TCP/IP. Similarly, aspects may be implemented using an object-oriented programming language, such as .Net, SmallTalk, Java, C++, Ada, C# (C-Sharp), Python, or JavaScript. Other object-oriented programming languages may also be used. Alternatively, functional, scripting, or logical programming languages may be used.

Additionally, various aspects and functions may be implemented in a non-programmed environment. For example, documents created in HTML, XML or other formats, when viewed in a window of a browser program, can render aspects of a graphical-user interface or perform other functions. Further, various examples may be implemented as programmed or non-programmed elements, or any combination thereof. For example, a web page may be implemented using HTML while a data object called from within the web page may be written in C++. Thus, the examples are not limited to a specific programming language and any suitable programming language could be used. Accordingly, the functional components disclosed herein may include a wide variety of elements (e.g., specialized hardware, executable code, data structures or objects) that are configured to perform the functions described herein.

In some examples, the components disclosed herein may read parameters that affect the functions performed by the components. These parameters may be physically stored in any form of suitable memory including volatile memory (such as RAM) or nonvolatile memory (such as a magnetic hard drive). In addition, the parameters may be logically stored in a propriety data structure (such as a database or file defined by a user space application) or in a commonly shared data structure (such as an application registry that is defined by an operating system). In addition, some examples provide for both system and user interfaces that allow external entities to modify the parameters and thereby configure the behavior of the components.

Based on the foregoing disclosure, it should be apparent to one of ordinary skill in the art that the embodiments disclosed herein are not limited to a particular computer system platform, processor, operating system, network, or communication protocol. Also, it should be apparent that the embodiments disclosed herein are not limited to a specific architecture or programming language.

Having now described some illustrative aspects of some embodiments, it should be apparent to those skilled in the art that the foregoing is merely illustrative and not limiting, having been presented by way of example only. It is to be appreciated various alterations, modifications, and improvements will readily occur to those skilled in the art. Such alterations, modifications, and improvements are intended to be part of this disclosure, and are intended to be within the scope of the disclosure. In particular, although many of the examples presented herein involve specific combinations of method acts or system elements, it should be understood that those acts and those elements may be combined in other ways to accomplish the same objectives. Accordingly, the foregoing description and drawings are by way of example only.

What is claimed is:

1. A system for determining a location of a device having an audio output device configured to generate an acoustic signal, the system comprising:
   a management component;
   a plurality of microphones including a first microphone and a second microphone;
   at least one receiving component, the at least one receiving component coupled to the plurality of microphones and configured to:
   sample the signals received from the plurality of microphones related to the acoustic signal generated by the audio output device and detected by the plurality of microphones during a predetermined time period;
   calculate a first set of zero crossing times and a second set of zero crossing times based on the respective samples of the signals received from the first and second microphones;
   determine a first average period for the acoustic signal using the first set of zero crossing times, and determine at least one of a start time and an end time of the signals from the first microphone using the first average period and the samples of the signals received from the first microphone;
   determine a second average period for the acoustic signal using the second set of zero crossing times, and determine at least one of a start time and an end time of the signals from the second microphone using the second average period and the samples of the signals from the second microphone;
   send one of the start time and the end time of the signals from the first microphone to the management component; and
   send one of the start time and the end time of the signals from the second microphone to the management component, the management component being configured to:
   calculate the location of the device using the one of the start time and the end time of the signals from the first microphone and the one of the start time and the end time of the signals from the second microphone.

2. The system according to claim 1, wherein the at least one receiving component includes a plurality of receiving components, a first receiving component of the plurality of receiving components is coupled to the first microphone, and a second receiving component of the plurality of receiving components is coupled to the second microphone.

3. The system according to claim 2, wherein the first receiving component further comprises a first clock and the second receiving component further comprises a second clock, wherein the first receiving component and the second receiving component are further configured to synchronize the first clock with the second clock.

4. The system according to claim 1, wherein calculating the first set of zero crossing times and the second set of zero crossing times further includes
   determining a first synthetic zero using the samples of the signals received from the first microphone, wherein using the samples of the signals includes determining a maximum value and a minimum value of the signals received from the first microphone, and
   determining a second synthetic zero using the samples of the signals received from the second microphone, wherein using the samples of the signals includes determining a maximum value and a minimum value of the signals received from the second microphone.

5. The system according to claim 1, wherein the management component is further configured to receive information descriptive of a height of a rack and a number of unit spaces in the rack and use the information to calculate a unit space of the device.

6. The system according to claim 1, wherein the at least one receiving component is further configured to filter the acoustic signal using a band-pass filter.

7. The system according to claim 1, wherein the management component is further configured to provide a representation of a rack including at least one representation of the location of the device in the rack.

8. A method for determining a location of a device, the method comprising:
- receiving, by a plurality of microphones including a first microphone and a second microphone, an acoustic signal from an audio output device positioned in or attached to the device;
- sampling, by at least one receiving component, signals received from the plurality of microphones related to the acoustic signal during a predetermined time period;
- calculating a first set of zero crossing times and a second set of zero crossing times based on the respective samples of the signals received from the first and second microphones;
- determining a first average period for the acoustic signal using the signals first set of zero crossing times, and determining at least one of a start time and an end time of the signals received from the first microphone using the first average period and the samples of the signals received from the first microphone;
- determining a second average period for the acoustic signal using the second set of zero crossing times, and determining at least one of a start time and an end time of the signals received from the second microphone using the second average period and the samples of the signals received from the second microphone; and
- calculating the location of the device using the one of the start time and the end time of the signals received from the first microphone and the one of the start time and the end time of the signals received from the second microphone.

9. The method according to claim 8, further comprising synchronizing a first clock of the at least one receiving component with at least one second clock of the at least one receiving component.

10. The method according to 8, wherein calculating the first set of zero crossing times and the second set of zero crossing times further includes
- determining a first synthetic zero using the samples of the signals received from the first microphone, wherein using the samples of the signals includes determining a maximum value and a minimum value of the signals received from the first microphone, and
- determining a second synthetic zero using the samples of the signals received from the second microphone, wherein using the samples of the signals includes determining a maximum value and a minimum value of the signals received from the second microphone.

11. The method according to claim 8, further comprising receiving information descriptive of a height of the rack and a number of unit spaces in the rack and using the information in calculating the location of the device.

12. The method according to claim 8, further comprising filtering the acoustic signal using a band-pass filter around a range of expected frequencies.

13. The method according to claim 8, further comprising presenting a representation of a rack including at least one representation of the location of the device in the rack.

14. A system for determining a location of a device having an audio output device configured to generate an acoustic signal, the system comprising:
- a management component;
- a plurality of microphones including a first microphone and a second microphone; and
- a controller coupled to the device and the plurality of microphones, the controller configured to:
  - sample the signals received from the plurality of microphones related to the acoustic signal generated by the audio output device and detected by the plurality of microphones during a predetermined time period;
  - calculate a first set of zero crossing times and a second set of zero crossing times based on the respective samples of the signals received from the first and second microphones;
  - determine a first average period for the acoustic signal using the first set of zero crossing times, and determine at least one of a start time and an end time of the signals from the first microphone using the first average period and the samples of the signals received from the first microphone;
  - determine a second average period for the acoustic signal using the second set of zero crossing times, and determine at least one of a start time and an end time of the signals from the second microphone using the second average period and the samples of the signals from the second microphone; and
  - send the one of the start time and the end time of the signals received from the first microphone and the one of the start time and the end time of the signals received from the second microphone to the management component to determine the location of the device.

15. The system according to claim 1, wherein the management component is in data communication with the device and configured to send a message to the device to generate the acoustic signal.

16. The method according to claim 8, further comprising sending a message to the device to generate the acoustic signal.

* * * * *